(12) United States Patent
Chang et al.

(10) Patent No.: US 8,551,833 B2
(45) Date of Patent: Oct. 8, 2013

(54) DOUBLE GATE PLANAR FIELD EFFECT TRANSISTORS

(75) Inventors: Josephine B. Chang, Mahopac, NY (US); Leland Chang, New York, NY (US); Chung-Hsun Lin, White Plains, NY (US); Jeffrey W. Sleight, Ridgefield, CT (US)

(73) Assignee: International Businesss Machines Corporation, Armonk, NY (US)

( * ) Notice: Subject to any disclaimer, the term of this patent is extended or adjusted under 35 U.S.C. 154(b) by 121 days.

(21) Appl. No.: 13/161,013

(22) Filed: Jun. 15, 2011

(65) Prior Publication Data

US 2012/0319178 A1     Dec. 20, 2012

(51) Int. Cl.
    *H01L 21/8238*     (2006.01)
(52) U.S. Cl.
    USPC ..... 438/199; 438/197; 438/689; 257/E21.632

(58) Field of Classification Search
    USPC .. 438/197, 199, 289, 689, 717; 257/E21.632
    See application file for complete search history.

(56) References Cited

U.S. PATENT DOCUMENTS

| 7,892,945 B2 | 2/2011 | Bedell et al. |
| 7,893,492 B2 | 2/2011 | Bedell et al. |

*Primary Examiner* — Hoai V Pham
(74) *Attorney, Agent, or Firm* — Tutunjian & Bitetto, P.C.; Vazken Alexanian (57) ABSTRACT

A stacked planar device and method for forming the same is shown that includes forming, on a substrate, a stack of layers having alternating sacrificial and channel layers, patterning the stack such that sides of the stack include exposed surfaces of the sacrificial and channel layers, forming a dummy gate structure over a region of the stack to establish a planar area, forming a dielectric layer around the dummy gate structure to cover areas adjacent to the planar area, removing the dummy gate structure to expose the stack, selectively etching the stack to remove the sacrificial layers from the channel layers in the planar area, and forming a gate conductor over and in between the channel layers to form a transistor device.

17 Claims, 6 Drawing Sheets

DOUBLE GATE PLANAR FIELD EFFECT TRANSISTORS

BACKGROUND

1. Technical Field

The present invention relates to semiconductor nanowire field effect transistors (FETs) and, in particular, to vertically stacked nanowire devices having double gate planar FETs and methods for making the same.

2. Description of the Related Art

Silicon nanowire-based metal oxide semiconductor field effect transistors (MOSFETs) are of interest due to their superior electrostatics. Semiconductor nanowire field effect transistors have been fabricated by generating a collection of nanowires and then placing them where desired (known as a bottom-up approach) or through lithographic patterning. However, for nanowires with small diameters, achieving the high layout density required for a competitive technology is challenging. For example, a nanowire field effect transistor (FET) with a body diameter of 10 nm would require a layout pitch of less than 32 nm simply to match the channel width density of planar devices. Reducing the body diameter to 5 nm reduces the required pitch to roughly 15 nm. This is well beyond the range of what optical lithography can currently provide, even with pitch doubling techniques.

Additionally, despite the advantages of nanowires, their small diameter is significantly limiting with respect to current carrying capacity. Furthermore, it can be difficult to form existing nanowire technologies on the same chip with other structures.

SUMMARY

A method for forming a stacked planar structure includes forming, on a substrate, a stack of layers having alternating sacrificial and channel layers, patterning the stack such that sides of the stack include exposed surfaces of the sacrificial and channel layers, forming a dummy gate structure over a region of the stack to establish a planar area, forming a dielectric layer around the dummy gate structure to cover areas adjacent to the planar area, removing the dummy gate structure to expose the stack, selectively etching the stack to remove the sacrificial layers from the channel layers in the planar area, and forming a gate conductor over and in between the channel layers to form a transistor device.

A method for forming a chip includes forming, on a substrate, a stack of layers having alternating sacrificial and channel layers, forming a fin mask onto the alternating layers to establish a nanowire location, forming a solid mask on the alternating layers to establish a planar location, forming a dummy gate structure over the masks, forming a dielectric layer around the dummy gate structure to cover areas adjacent to the masks, removing the dummy gate structure to expose the masks, etching the stack around the fin mask and the planar mask to expose a fin portion of the stack at the nanowire location and a planar portion of the stack at the planar location, selectively etching the stack to remove the sacrificial layers from the channel layers in the fin portion and the planar portion, and forming a gate conductor over and in between the channel layers to form a transistor device.

A transistor device includes a plurality of planar layers of channel material connecting a source region and a drain region, wherein the planar layers are formed in a stack of layers of a channel material, and a gate formed around and between the planar layers of channel material.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Vertically stacking nanowires allows for an increase in channel width layout density. Meanwhile, a self-aligned gate-to-landing pad structure enables tight gate pitch. Described briefly, the present principles allow for the creation of small-diameter nanowires arranged in a vertical mesh to form a gate-all-around (GAA) field effect transistor (FET). The present principles also provide for planar double-sided FETs. A similar process is employed for both, where the type of device that is produced may be determined by determining the shape of a hardmask as described below. Relative to the nanowire design, the double-sided planar FETs have substantially higher current capacity and lower threshold voltages.

Nanowire and planar FETs may be formed according to the present principles using chemical etching. Layers of nanowire material and sacrificial material are alternately layered on top of a substrate. Using a hardmask and a dummy gate to define the positions of channels, sacrificial material may be selectively removed to expose the nanowires and/or planes. A final gate is then introduced, filling the gaps between the wire or planes. In this manner, vertically stacked nanowires and planes are produced having a thickness below that which is possible using optical lithography. Although only nanowires and planes are discussed herein, it is contemplated that other structures could be formed using the present principles, based on the shape and size of the applied hardmask as described below. The present principles also permit for these structures to be formed simultaneously, using a single process.

It is to be understood that the present invention will be described in terms of a given illustrative architecture having a wafer; however, other architectures, structures, substrate materials and process features and steps may be varied within the scope of the present invention.

Designs described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
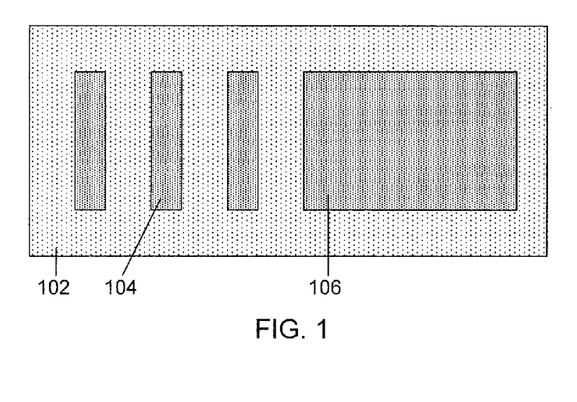
FIG. 1 is a diagram that shows nanowires hardmasks and planar hardmasks on the same chip according to the present principles.

Referring now to the drawings in which like numerals represent the same or similar elements and initially to FIG. 1, a chip 102 is shown having nanowire hardmasks 104 and a planar hardmask 106. By forming both types of devices on a single chip, each may be employed for its respective advantages.

Figure 2:
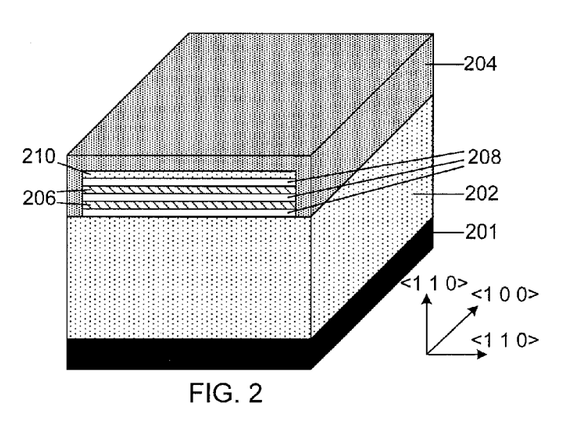
FIG. 2 is a diagram that shows stacked layers of channel material and sacrificial material according to the present principles.
Figure 4:
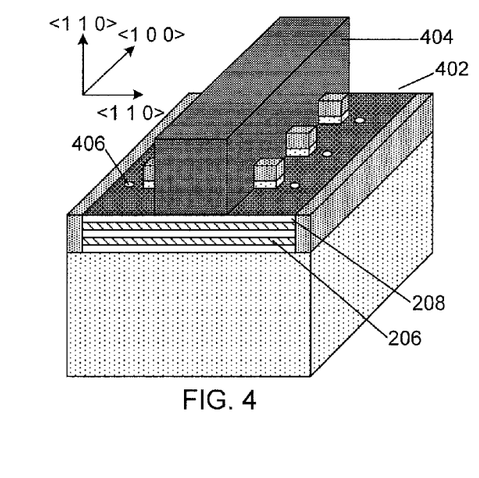
FIG. 4 is a diagram that shows a dummy gate according to the present principles.

Referring now to FIG. 2, the formation of stacked layers is shown. A substrate may include an insulator layer 201 formed from, e.g., silicon, and a dielectric layer 202 formed from, e.g., silicon oxide ($SiO_2$). The insulator layer 201 and dielectric layer 202 may be grown epitaxially. Channel layers 208 and sacrificial layers 206 may be formed on the dielectric layer 202 and may include, for example, silicon and SiGe respectively. Another dielectric layer 210 may be formed on top and may include, for example, $SiO_2$. The sacrificial layers 206 may use either n+ or p+ doped SiGe. This may be accomplished by, for example, starting with a silicon-on-insulator (SOI) wafer, thinning the top silicon down to the desired thickness, and then epitaxially growing alternating crystalline sacrificial material 206 and channel material 208 on top of the thinned silicon. Crystal orientations <1 1 0> and <1 0 0> are shown for reference. To enable directional etching of a sacrificial material such as SiGe, the starting SOI wafer may be chosen to be of a <1 1 0> crystal orientation. The active regions of the alternating layers 206 and 208 are then patterned by, for example, photolithography followed by reactive ion etching (RIE) isolation of active regions from one another. Such isolation may be performed for example by shallow trench isolation (STI), where non-active regions are filled with a dielectric such as $SiO_2$ to planarize the surface of the substrate 202. Alternatively, mesa isolation may be used where non-active regions are simply etched away. In FIG. 4 below, a device is planarized and employs shallow trench isolation with a dielectric liner 204 including, e.g., a nitride.

Figure 3:
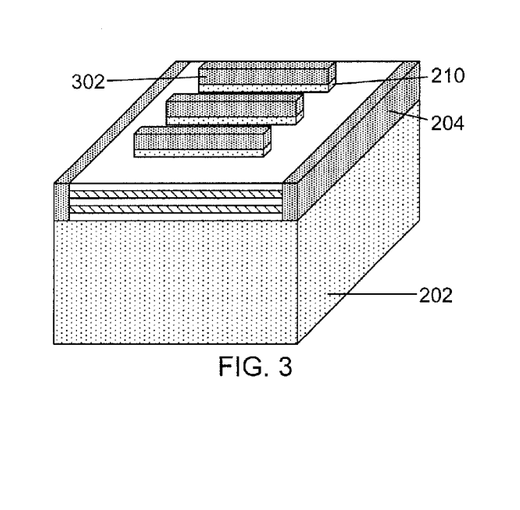
FIG. 3 is a diagram that shows a hardmask pattern to produce stacked nanowires according to the present principles.

Referring now to FIG. 3, hardmask patterning is shown. The layer 204 and a top layer 210 are etched to form a pattern 302 to specify the positions of the nanowires. Nanowire mesh (FIG. 10) and stacked planar (FIG. 16) structures may both be formed on the same chip simply by choosing appropriate hardmasks, as discussed in further detail below.

Referring now to FIG. 4, a dummy gate 404 is shown. After the hardmask patterning 302, an etch stop layer 402 may be grown over exposed active region to use as an etch stop for the next step. The etch stop layer 402 may include, for example, a thin oxide layer. The dummy gate 404 further specifies the positions of the nanowires/planes and also represents the eventual location of the device's gate. The dummy gate 404 may be formed from, e.g., poly-silicon plus a silicon nitride hardmask. To enable a directional etch of, for example, a sacrificial layer 206, the dummy gate 404 should preferably be oriented along the <100> direction, as illustrated. Junction engineering to exposed source/drain regions 406 may be performed at this point. For example, a top-down implant may be employed to dope the top layers 208, the source/drain regions 406 may be recessed and implanted with an angled implant, or the source/drain regions 406 may be recessed and then filled in with an epitaxially grown embedded source/drain. Spacers (not shown) formed on the sidewalls of the dummy gate 404 could be used for adjusting the distance of these junction engineering processes from the channel. For some processes, such as the source/drain 406 recess or embedded source/drain 406 growth, a dummy gate hardmask (not shown) such as SiN should be included as the top layer of the dummy gate material stack to protect the dummy gate 404 during the junction engineering steps.

To form contacts 406 for the devices, sacrificial material 206 may be a conductor or a semiconductor. In the case of a semiconductor (such as SiGe), the sacrificial material 206 may be heavily doped so that it is conductive. In the case of a source/drain 406 formed of heavily doped silicon/SiGe layers, current could flow freely through the layers. In the case of a recessed source/drain with epitaxially grown embedded source/drain regions 406, the source/drain regions 406 would be uniform. Silicide/contact vias would go on top of the source/drain 406 as in a normal complementary metal-oxide semiconductor silicon process flow.

Figure 5:
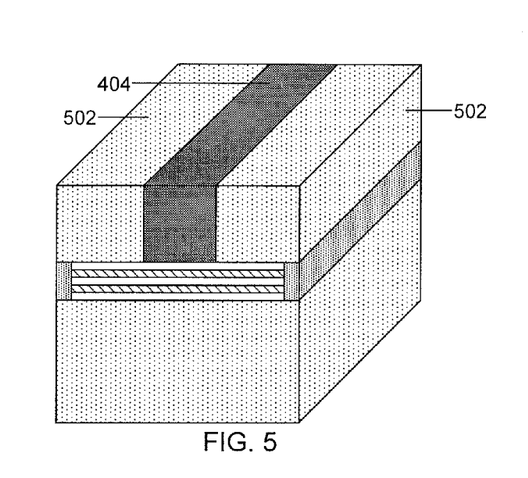
FIG. 5 is a diagram that shows sacrificial material around the dummy gate according to the present principles.

Referring now to FIG. 5, a dielectric fill is shown. Sacrificial dielectric 502 fills in alongside the dummy gate 404 and is then planarized. The sacrificial dielectric may include, for example, $SiO_2$ or other materials.

Figure 6:
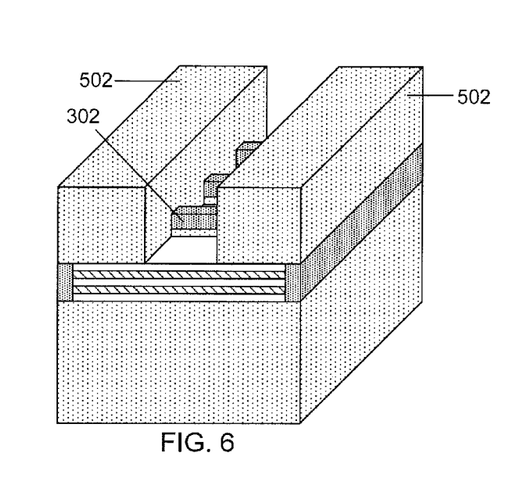
FIG. 6 is a diagram that shows the removal of the dummy gate to expose parts of the hardmask according to the present principles.

Referring now to FIG. 6, parts of a fin hardmask pattern 302 are exposed after the removal of the dummy gate 404. In the case of a planar device, the solid hardmask 1202 (see FIG. 12 below) will be exposed within the sacrificial dielectric 502. The exposed hardmask 302 represents the final positions of the nanowires. The dummy gate 404 of FIG. 5 may be removed using chemical etching or RIE to expose the hardmask 302.

Figure 7:
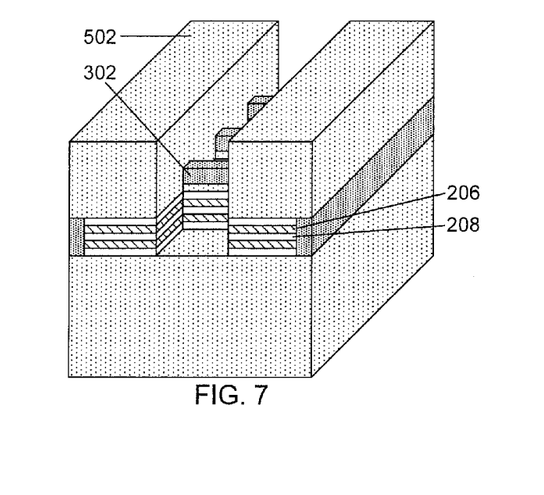
FIG. 7 is a diagram that shows a fin etch according to the present principles.

Referring now to FIG. 7, the hardmask pattern 302 is etched down into the SiGe/silicon stack of alternating layers 206 and 208. This exposes the layers 206 and 208. The etching may be performed using any suitable process.

Figure 8:
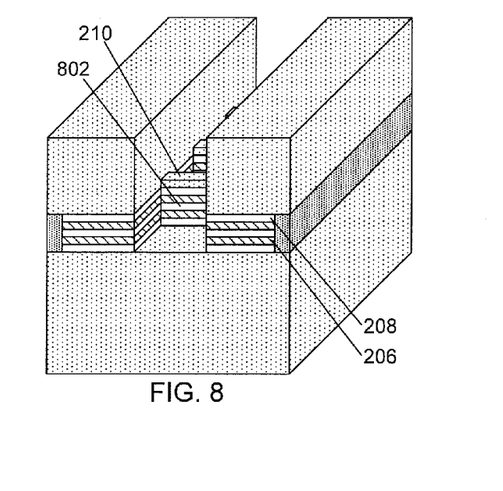
FIG. 8 is a diagram that shows removal of the hardmask according to the present principles.

Referring now to FIG. 8, fins 802 are exposed after an etch process removes the nitride hard mask pattern 302 of FIG. 7. The top layer 210 of $SiO_2$ remains on channel layers 208 and sacrificial layers 206.

Figure 9:
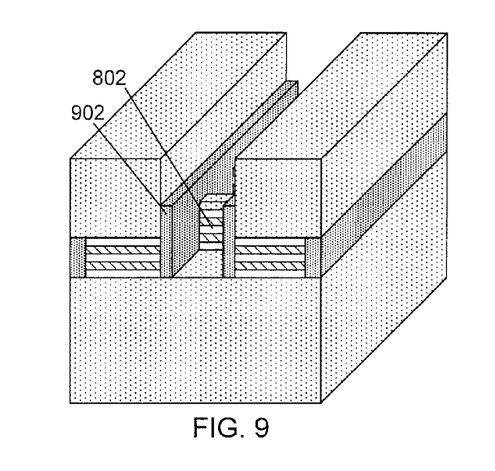
FIG. 9 is a diagram that shows formation of sidewalls according to the present principles.

Referring now to FIG. 9, a spacer 902 is formed with a substantial overetch that clears the sidewalls of exposed fins 902. The spacer 902 may include a nitride or other materials. The spacer 902 protects the sidewalls of the fins 802 from subsequent etching.

Figure 10:
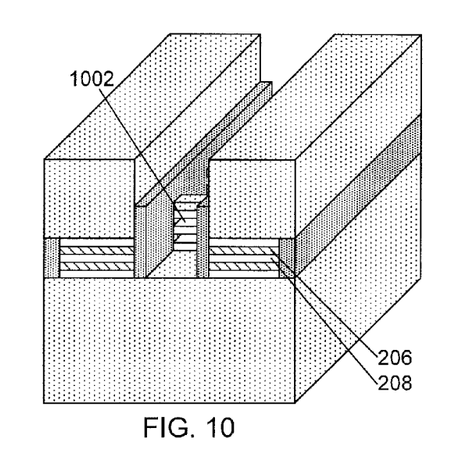
FIG. 10 is a diagram that shows removal of sacrificial material to form nanowires according to the present principles.

Referring now to FIG. 10, exposed nanowires 1002 are shown. The sacrificial layers 208 are removed simultaneously from the nanowires using directionally selective etching, for example, with chemical etching using the above-described materials, with dry etching, or with low-temperature wet or dry oxidation. This leaves the channel layers 208 to form the nanowires 1002. Solid source diffusion annealing is employed to dope the source and drain regions of nanowires 1002. Differential chemical oxidation may be employed to preferentially oxidize the heavily doped SiGe of sacrificial layer 208 while forming only an interfacial layer on the undoped silicon.

Figure 11:
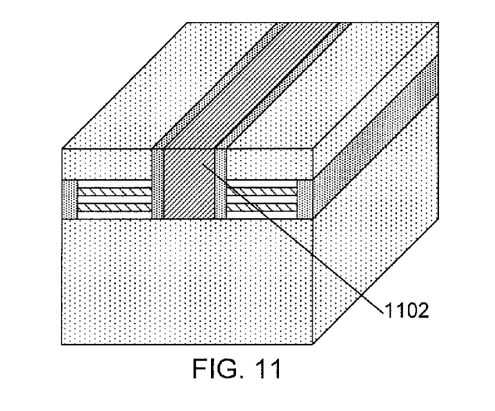
FIG. 11 is a diagram that shows the formation of a gate according to the present principles.

Referring now to FIG. 11, a nanowire structure is shown. The device is filled in with a gate stack 1102 and planarized to form a smooth surface. The gate stack 1102 may include a dielectric such as $SiO_2$ or $HfO_2$, a workfunction setting metal such as TiN or TaN, and then a filler metal such as Al or W that completely surrounds the nanowires 1002 and fills the space left by the removal of dummy gate 404 in FIG. 6. Due to the topography of the channels and the narrow space between the channel layers 208, the gate stack material may be deposited with extremely conformal methods such as low-pressure chemical vapor deposition (LPCVD) or atomic layer deposition (ALD).

Figure 12:
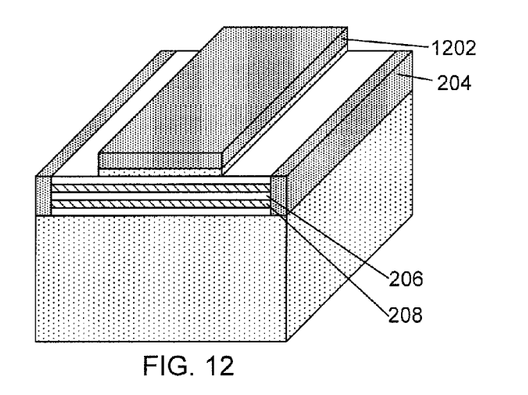
FIG. 12 is a diagram that shows a hardmask to form stacked planes according to the present principles.

Referring now to FIG. 12, an alternative embodiment is shown that produces a double-sided gate planar FET. Instead of employing a fin pattern 302 shown in FIG. 3, a solid hardmask pattern 1202 is fanned by etching the layer 204. The hardmask may include, for example, silicon nitride. The hardmask 1202 is not necessary if only planar devices are desired, but protects the stacked planar layers from the etch described above with respect to FIG. 7. The solid hardmask 1202 protects the underlying layers 206 and 208.

Figure 13:
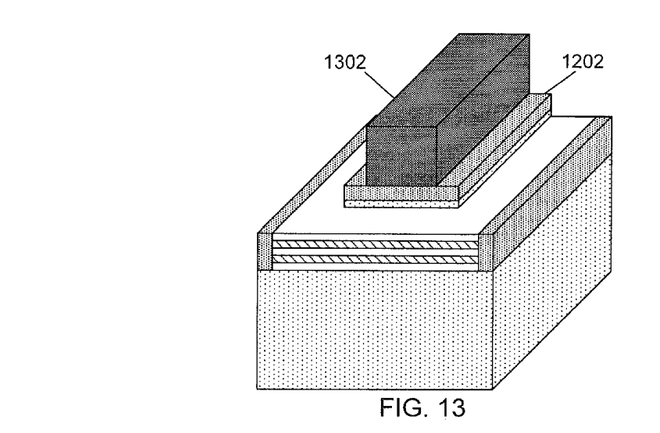
FIG. 13 is a diagram that shows a dummy gate to establish a planar location according to the present principles.

Referring now to FIG. 13, a dummy gate 1302 is shown disposed over the hardmask 1202. As described above with respect to FIG. 4, the dummy gate establishes the location of the subsequent planar device.

Figure 14:
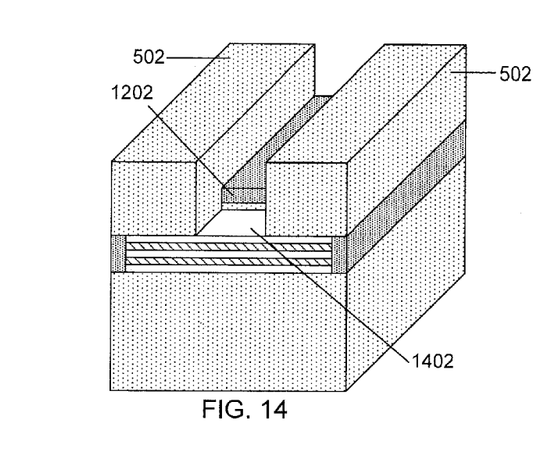
FIG. 14 is a diagram that shows the formation of sacrificial material over a solid hardmask and the removal of the dummy gate according to the present principles.

Referring now to FIG. 14, the formation of sacrificial dielectric fills 502 and the removal of the dummy gate is shown. Solid hardmask 1202 is exposed between the fills 502. Also shown is a portion of material 1402 at the edge of the solid hardmask 1202 which was not covered. This exposed material 1402 will be etched as shown in FIG. 15.

Figure 15:
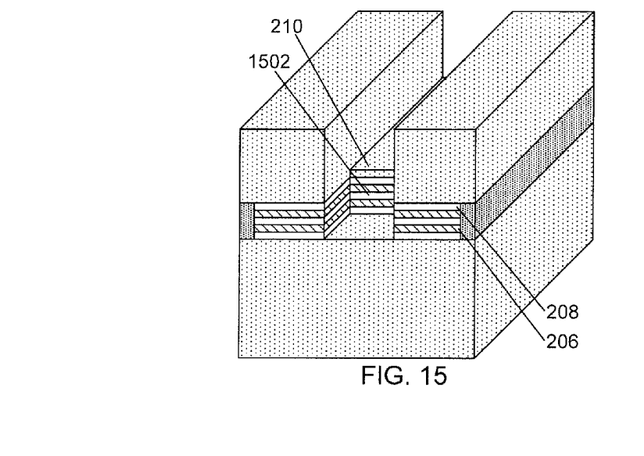
FIG. 15 is a diagram that shows the removal of the hardmask and the exposure of stacked planar layers according to the present principles.

Referring now to FIG. 15, an etch process removes the exposed stacked layers 206 and 208, as above in FIG. 8, but does not affect the portions that were covered by hardmask 1202. The hardmask 1202 is removed to expose top layer 210. A shelf 1502 permits access for a subsequent etch of the sacrificial layers 206.

Figure 16:
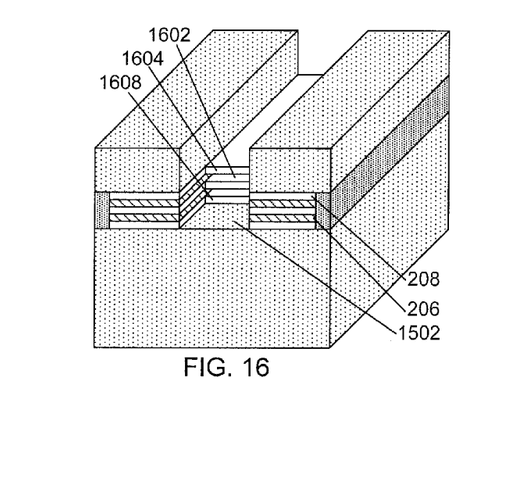
FIG. 16 is a diagram that shows etched planar layers according to the present principles.

Referring now to FIG. 16, a planar gap structure 1602 is shown. An undercut etch employing, for example, a directionally selective etch, is employed to remove sacrificial material 206 between the channel layers 208, forming gaps 1602. To access the sides of the stacks, the shelf 1502 provides an opportunity for the etch to reach the sacrificial material 206. After performing the etch, gate material can be filled in as shown in FIG. 11.

As an example, if a 10:1 directionally selective etch is used, a gate with a length of 20 nm could be created by starting with a 10 nm trench 1502 that allows for a 5 nm expansion on either side. This allows for a 50 nm release in the desired direction from both sides, allowing for a maximum "fin width" of 100 nm. In such a structure, it may be assumed that the bottom layer of silicon 208 is not fully released, such that two double-gated silicon channel planes 1604 may be formed on top of one single-gated silicon channel plane 1606. This provides an exemplary current carrying area of 5× the layout area. So for example, in a layout area of 1 micron with a normal planar device (using, e.g., bulk silicon or silicon-on-insulator), there would be 1 μm of channel area. With a 10 nm diameter nanowire at a 40 nm pitch, there would be 785 nm of carrying area. With three stacked 10 nm nanowires 1002 (see FIG. 10), there would be 2356 nm of current carrying area. But, with 100 nm wide stacked sheets 1604 and 1606, allowing for 28 nm between each stack of sheets, there would be 4000 nm of current carrying area. These values are illustrative and are not intended to be limiting. Other sizes may be used according to the present principles.

This increased amount of current per layout area is advantageous for driving large loads, such as in I/O devices and power devices, and provides the ability to modulate the amount of current generated per layout area.

For very small dimensions, e.g., less than 6 nm, quantum confinement comes into play, causing the ground state of the carriers to go up, resulting in a higher threshold voltage. For this range of dimensions, relaxing the confinement from 2D confinement (such as in a nanowire 1002) to 1D confinement (such as in a thin sheet of silicon 1604) relaxes the quantum confinement as well, giving designers a simple variable for fine-tuning threshold voltage in a transistor to suit the on/off current balance that is desired for each particular device in their design.

Figure 17:
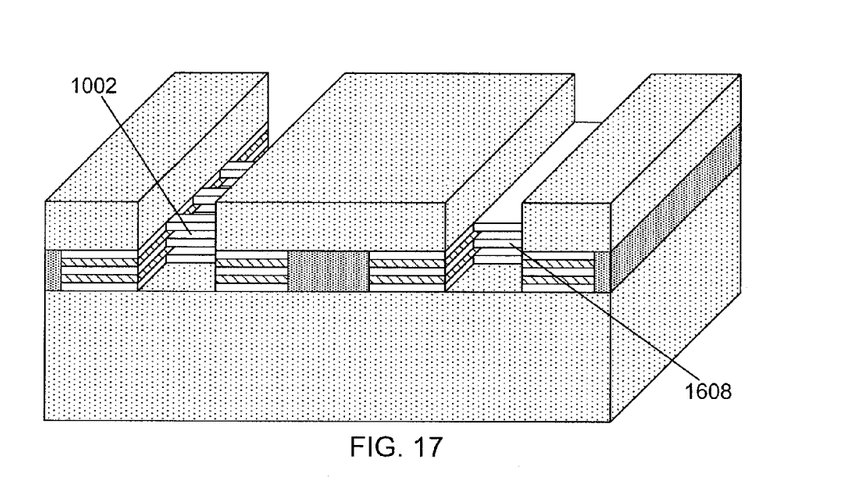
FIG. 17 is a diagram that shows a nanowire structure and a planar structure formed on a single chip.

Referring now to FIG. 17, a nanowire structure 1002 and a planar gap structure 1602 are shown on a single chip. By employing the present principles, the structures may be formed simultaneously, using a single process, thereby greatly increasing design flexibility and fabrication efficiency. A gate structure 1102 is formed over and around each structure.

Figure 18:
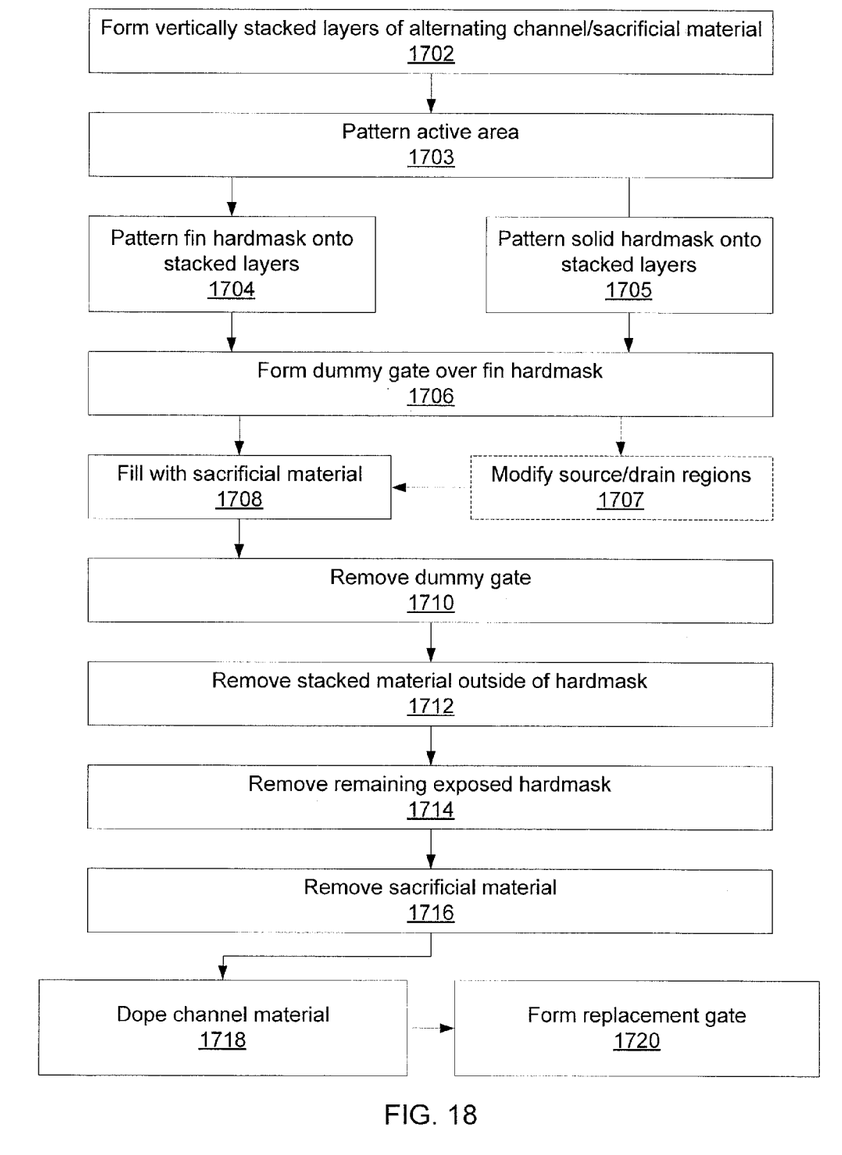
FIG. 18 is a block/flow diagram that shows an exemplary method for forming stacked nanowire/planar devices according to the present principles.

Referring now to FIG. 18, a block/flow diagram is shown for producing nanowire or double-sided gate planar FETs. Block 1702 forms vertically stacked layers of alternating channel and sacrificial material directly on one another and onto a substrate. The substrate may be formed from, e.g., silicon oxide ($SiO_2$), though it is contemplated that other substrate materials may be used instead. A channel material, which will eventually form the nanowires, may be made from silicon, while the sacrificial material may be silicon-germanium (SiGe). It is contemplated that n+ or p+ SiGe may be used as a sacrificial material, though those having skill in the art would be able to select any other suitable sacrificial material according to the present principles. Similarly, the channel material is not limited to silicon, but may be formed from any suitable substance.

Temperature budget of growth and processing should be limited to a temperature low enough to avoid inter-diffusion of separate layers. For example, for a Si/SiGe stack, processing temperatures should preferably remain below 800° C. In addition to or instead of the materials described above, the following materials may be used: Ge, $Si_xGe_yC_z$, $Si_xC_y$, and $Ge_xC_y$, with the respective compounds in any appropriate proportion. This list is not intended to be exhaustive. The addition of carbon (C) can be used to increase the critical thickness of strained SiGe or Ge layers, in addition to reducing unintentional doping of silicon interlayers. Growth pressure is preferably kept below 50 Torr to minimize oxygen incorporation. SiGe and Ge interlayers can be doped using, e.g., $PH_3$ or $AsH_3$ for an n-dopant and $B_2H_6$ for a p-dopant.

Block 1703 defines, patterns, and isolates the active regions of the device. Patterning may be done by, for example, photolithography followed by reactive-ion etching (RIE). Isolation may be done, for example, by shallow trench isolation (STI), where non-active regions are filled with a dielectric such as $SiO_2$ to planarize the surface of the substrate, or mesa isolation, where non-active regions are simply etched away. Depending on whether a nanowire mesh device or a planar device is desired, processing continues to block 1704 or block 1705. Block 1704 patterns fins onto the stacked layers using a hard mask, e.g., formed with silicon nitride. The hard mask defines the location of the nanowires along one coordinate. Block 1705 patterns a solid hardmask that defines in part the area for the eventual planar FETs. By selecting the size and shape of the hardmask, one may select the size and shape of the resulting structures. This is not limited to wires and planes, but may reflect any desired shape. As will be discussed below, however, if a directional etch is used, such etching may limit the full range of possible shapes. Additionally, the characteristics of the etch will limit how dense the structures may be made as well as how close together they may be placed. It should also be noted that, if a chip design includes only planar devices, the hardmask may be omitted, but that a chip which includes both devices or which includes only nanowire devices will need to use such a mask. Block 1703 active area isolation may alternately be done after hardmask definition.

Block 1706 forms a dummy gate over the hardmasks out of, for example, a poly-silicon or silicon nitride material stack. The dummy gate defines the location of nanowires in another direction and also establishes the position of eventual gates. Block 107 optionally modifies source/drain regions, which are the regions of active area not covered by the dummy gate, using, any combination of spacers, implants, recess etches, and/or epitaxial growth of embedded materials. Block 1708 then fills in sacrificial material (e.g., dielectric) around the dummy gate. Block 1710 removes the dummy gate using, e.g., chemical etching or RIE, thereby exposing the hardmask.

Block 1712 anisotropically removes stacked material that is not covered by the hardmask, e.g., by an RIE process. If fin hardmasks were formed in block 1704, this produces fins of stacked channel and sacrificial material. If a solid hardmask was formed in block 1705, this step may remove only the ends of active regions near the STI boundary which are not covered by the solid hardmask. The solid hardmask of step 1705 is used to protect the layers which will form a planar device from the etching process than forms the nanowire fins.

Block 1714 removes any remaining exposed hardmask, uncovering the stacked structures left by block 1712. Block 1716 removes sacrificial material from between the nanowires and the planar layers simultaneously. Removal of sacrificial layers may be performed using selective etching. If SiGe is used as a sacrificial layer, the removal can be done chemically using any suitable chemical that exploits the lower oxidation potential of SiGe compared to silicon. In one embodiment, a chemical mixture that includes one or more of hydrogen fluoride, hydrogen peroxide, and acetic acid may be employed. For example, $HF+H_2O_2+CH_3COOH$ may be employed in a ratio of 1:2:3 by volume. In another embodiment, a mixture of sulfuric acid and hydrogen peroxide may be employed using known mixture ratios to perform the etch. Dry etching may also be used with such techniques as $O_2$ plasma or plasma chemistries typically used for etching metals. This etching can be performed using low temperature (e.g., less than 750° C.) wet or dry oxidation at any pressure. Hyperbaric oxidation (e.g., 10 ATM) at 650° C. shows, for example, a factor of 70 increase in oxidation rate for SiGe as compared to silicon. The layers should be kept below 800° C. to minimize interdiffusion between the SiGe and silicon layers. Such oxidation processes can be used to oxidize SiGe while only producing a thin, self-limiting interfacial oxide on the undoped silicon nanowires. This reduces gate capacitance.

For planar layers, a directionally selective etch is useful. By using an etch which preferentially removes material according to crystal face orientation, sacrificial material may be removed from between planar layers without affecting nearby structures. For example, etch rates associated along a <0 0 1> direction in SiGe layers may be ten times greater than etch rates along <1 1 0> directions. To perform such an etch, hydrochloric gas for example may be applied at an exemplary temperature between 485 and 560 degrees Celsius, with higher temperatures resulting in a more rapid etch. This etch will preferentially remove sacrificial material between planar layers with only a small amount of "leakage" in transverse directions. Transverse etch times provide a functional limitation on directionally selective etching, as the etch will eventually undercut support structures or will affect nearby devices. As such, the speed of transverse etching puts a limit on how close devices may be placed to one another.

After removing the sacrificial material from the channel region, SiGe, for example, may be used for solid-source doping of source and drain regions. This enables better vertical uniformity in junction profiles as compared to that attainable with top-down implants. In this way, the height of the device (the number of stacked nanowires or planes) is not limited by an ability to define source and drain junctions from a top-down implant.

The remaining channel material is optionally doped at block 1718, and a new gate is formed at block 1720. Nanowires need not be doped but, if so, such doping may occur before differential chemical oxidation. Solid source diffusion annealing may be used to dope the silicon source and drain regions and activate dopants. Differential chemical oxidation may be used to preferentially oxidize heavily doped SiGe while forming only an interfacial layer on undoped silicon nanowires. Depending on the shape produced by the hardmask in blocks 1704 and 1705, this may result in a nanowire mesh FET or in a planar FET. It is also contemplated that other shapes may be formed according to the present principles, creating layered chip device structures based on hardmask patterns other than those shown above. Because of the shared stacked-material structure, such devices may be formed together on a single chip.

Having described preferred embodiments of double gate planar FETs and method for making the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a stacked planar structure comprising
   forming, on a substrate, a stack of layers having alternating sacrificial and channel layers;
   forming a dummy gate structure over a region of the stack to establish a planar area;
   forming a dielectric layer around the dummy gate structure to cover areas adjacent to the planar area;
   removing the dummy gate structure to expose the stack;
   etching the stack only in regions that are outside of the planar area and uncovered by the dielectric layer, such that sides of the stack include exposed surfaces of the sacrificial and channel layers;
   selectively etching the stack to remove the sacrificial layers from the channel layers in the planar area; and
   forming a gate conductor over and in between the channel layers to form a transistor device.

2. The method of claim 1, wherein selectively removing comprises performing a directionally selective etch.

3. The method of claim 1, further comprising forming a hardmask pattern on the stack to pattern the stack.

4. The method of claim 1, further comprising doping the planes of channel material using source diffusion annealing.

5. The method of claim 1, wherein the channel material is silicon and the sacrificial material is silicon-germanium.

6. The method of claim 1, further comprising forming a fin mask to establish a location for nanowire formation.

7. The method of claim 6, further comprising etching the stack around the fin mask to form etched stacked layers.

8. The method of claim 7, wherein the etched stacked layers connect to source and drain regions and further comprising spacers along junctions between the source and drain regions and the etched stacked layers.

9. A method for forming a chip comprising:
   forming, on a substrate, a stack of layers having alternating sacrificial and channel layers;
   forming a fin mask onto the alternating layers to establish a nanowire location;
   forming a solid mask on the alternating layers to establish a planar location;
   forming a dummy gate structure over the masks;
   forming a dielectric layer around the dummy gate structure to cover areas adjacent to the masks;
   removing the dummy gate structure to expose the masks;
   etching the stack around the fin mask and the planar mask to expose a fin portion of the stack at the nanowire location and a planar portion of the stack at the planar location;
   selectively etching the stack to remove the sacrificial layers from the channel layers in the fin portion and the planar portion; and
   forming a gate conductor over and in between the channel layers to form a transistor device.

10. The method of claim 9, wherein said selectively removing comprises performing a directionally selective etch.

11. The method of claim 9, further comprising doping the nanowires and planes of channel material using source diffusion annealing.

12. The method of claim 9, wherein the channel material is silicon and the sacrificial material is silicon-germanium.

13. The method of claim 9, further comprising isolating the at least one nanowire channel and the at least one planar channel using shallow trench isolation.

14. The method of claim 9, further comprising forming spacers at the ends of the fin portion of the stack to protect the etched stack.

15. A method for forming a stacked planar structure comprising
    forming, on a substrate, a stack of layers having alternating sacrificial and channel layers;
    etching the stack in regions outside of a planar area that is defined by a planar hardmask and a dielectric sidewall, such that sides of the stack include exposed surfaces of the sacrificial and channel layers;
    selectively etching the stack to remove the sacrificial layers from the channel layers in the planar area; and
    forming a gate conductor over and in between the channel layers to form a transistor device.

16. The method of claim 1, wherein each dimension of the planar area is substantially greater than a thickness of any layer of sacrificial or channel material in the stack.

17. The method of claim 15, wherein a length and width of the planar hardmask are each substantially greater than a thickness of any layer of sacrificial or channel material in the stack.

* * * * *